(12) United States Patent
Lee et al.

(10) Patent No.: US 8,791,468 B2
(45) Date of Patent: Jul. 29, 2014

(54) GAN FILM STRUCTURE, METHOD OF FABRICATING THE SAME, AND SEMICONDUCTOR DEVICE INCLUDING THE SAME

(75) Inventors: Joo-ho Lee, Seongnam-si (KR); Jun-hee Choi, Hwaseong-si (KR); Sang-hun Lee, Seoul (KR); Mi-jeong Song, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 28 days.

(21) Appl. No.: 13/270,569

(22) Filed: Oct. 11, 2011

(65) Prior Publication Data

US 2012/0267638 A1 Oct. 25, 2012

(30) Foreign Application Priority Data

Apr. 19, 2011 (KR) .......................... 10-2011-0036374

(51) Int. Cl.
*H01L 27/15* (2006.01)

(52) U.S. Cl.
USPC .......... 257/79; 257/76; 257/81; 257/E33.033; 257/E33.057

(58) Field of Classification Search
USPC ........... 257/76, 79, 81, 84, E33.033, E33.057
See application file for complete search history.

(56) References Cited

U.S. PATENT DOCUMENTS

| 7,754,514 | B2 * | 7/2010 | Yajima et al. | 438/46 |
| 7,781,242 | B1 * | 8/2010 | Chen et al. | 438/29 |
| 2006/0261370 | A1 | 11/2006 | Hoke et al. | |
| 2010/0308355 | A1 * | 12/2010 | Hsieh et al. | 257/98 |
| 2011/0049549 | A1 * | 3/2011 | Kim et al. | 257/98 |
| 2011/0121330 | A1 * | 5/2011 | Tak et al. | 257/94 |
| 2011/0133175 | A1 * | 6/2011 | Ryu et al. | 257/43 |

FOREIGN PATENT DOCUMENTS

| JP | 08-139361 A | 5/1996 |
| JP | 10-188938 A | 7/1998 |
| JP | 2004-055811 A | 2/2004 |
| JP | 2006-114548 A | 4/2006 |
| JP | 2008-230868 A | 10/2008 |
| JP | 2009-130010 A | 6/2009 |

* cited by examiner

*Primary Examiner* — Julia Slutsker
(74) *Attorney, Agent, or Firm* — Harness, Dickey & Pierce, P.L.C.

(57) ABSTRACT

A method of fabricating a gallium nitride (GaN) thin layer, by which a high-quality GaN layer may be grown on a large-area substrate using an electrode layer suspended above a substrate, a GaN film structure fabricated using the method, and a semiconductor device including the GaN film structure. The method includes forming a sacrificial layer on a substrate, forming a first buffer layer on the sacrificial layer, forming an electrode layer on the first buffer layer, forming a second buffer layer on the electrode layer, partially etching the sacrificial layer to form at least two support members configured to support the first buffer layer and form at least one air cavity between the substrate and the first buffer layer, and forming a GaN thin layer on the second buffer layer.

19 Claims, 7 Drawing Sheets

GAN FILM STRUCTURE, METHOD OF FABRICATING THE SAME, AND SEMICONDUCTOR DEVICE INCLUDING THE SAME

CROSS-REFERENCE TO RELATED APPLICATIONS

This application claims the benefit of Korean Patent Application No. 10-2011-0036374, filed on Apr. 19, 2011, in the Korean Intellectual Property Office, the disclosure of which is incorporated herein in its entirety by reference.

BACKGROUND

1. Field

Some example embodiments relate to a gallium nitride (GaN) film structure, a method of fabricating the GaN film structure, and/or a semiconductor device including the GaN film structure. For example, some example embodiments relate to a method of fabricating a GaN thin layer, by which a high-quality GaN layer may be grown on a large-area substrate using an electrode layer suspended above a substrate, a GaN film structure fabricated using the same, and a semiconductor device including the GaN film structure.

2. Description of the Related Art

Gallium nitride (GaN) may be a Group III-V compound semiconductor material. In general, a GaN-based semiconductor device may have a higher breakdown voltage and higher high-temperature stability than semiconductor devices formed of other compound semiconductor materials. Thus, a GaN-based semiconductor device has widely been employed in high-power apparatuses or apparatuses susceptible to high temperatures. Also, GaN has been utilized in semiconductor laser devices and light-emitting diode (LED) devices due to its desirable light emission effect. However, crystallizing GaN may be relatively difficult.

GaN may be fabricated on a heterogeneous substrate having a hexagonal crystal system, such as a sapphire ($Al_2O_3$) or silicon carbide (SiC) substrate, using a metal organic chemical vapor deposition (MOCVD), a molecular beam epitaxy (MBE), or a hydride vapor phase epitaxy (HVPE) method. However, since a relatively small sized $Al_2O_3$ or SiC substrate has been used, e.g., about 2 inches, previously, producing GaN crystals in large quantities may be difficult, thereby precluding a reduction in the fabrication cost of GaN crystals. Despite a recent growing tendency to convert 2-inch substrates into 4-inch substrates, the 4-inch substrates are still expensive. Furthermore, when GaN crystals are grown to a relatively large area, a substrate may be easily deformed due to a difference in coefficient of thermal expansion between the substrate and GaN, thus precluding formation of the GaN crystals.

In another method, growing GaN crystals on, for example, a silicon (Si) substrate, has been proposed. However, since there are big differences in the lattice constant and coefficient of thermal expansion between Si and GaN, the grown GaN crystals may have a considerably high crystal defect density and suffer from a frequent occurrence of cracks. When a relatively inexpensive glass substrate is used as a substrate, since the substrate may be greatly deformed due to a high growth temperature above about 1000° C., growing a GaN layer on an amorphous substrate, such as the glass substrate, may be extremely difficult.

SUMMARY

Some example embodiments include a method of fabricating a gallium nitride (GaN) thin layer, by which a high-quality GaN layer may be grown on a large-area substrate. Some example embodiments also include a GaN film structure fabricated using the above-described method and/or a semiconductor device including the GaN film structure. Additional aspects will be set forth in part in the description which follows and, in part, will be apparent from the description, or may be learned by practice of example embodiments.

According to one example embodiment, a GaN film structure includes a substrate, at least two support members, a first buffer layer, an electrode layer, a second buffer layer, and a GaN thin layer. At least two support members are partially disposed on a substrate. A first buffer layer is configured to extend along surfaces of the at least two support members. An electrode layer is disposed on the first buffer layer, a second buffer layer is disposed on the electrode layer, and a GaN thin layer is disposed on the second buffer layer. The at least two support members define at least one air cavity between the substrate and the first buffer layer.

The first buffer layer may be formed of at least one of aluminum nitride (AlN) and silicon nitride ($SiN_x$). In addition, the electrode may be formed of at least one of molybdenum (Mo), titanium (Ti), ruthenium (Ru), chrome nitride (CrN), and tantalum nitride (TaN). The second buffer layer may be formed of aluminum nitride (AlN). The GaN film structure may further include a strain compensation layer interposed between the second buffer layer and the GaN thin layer. The GaN film structure may further include a GaN buffer layer interposed between the strain compensation layer and the GaN thin layer.

According to one example embodiment, a semiconductor device includes the above-described GaN film structure.

According to one example embodiment, a semiconductor light emission device includes a substrate, at least two support members, a first buffer layer, a lower electrode layer, a second buffer layer, an n-GaN layer, an active layer, a p-GaN layer and a p-electrode layer. At least two support members are partially disposed on the substrate. A first buffer layer is configured to extend along surfaces of the at least two support members. A lower electrode layer is disposed on the first buffer layer, a second buffer layer is disposed on the lower electrode layer, an n-GaN layer is disposed on the second buffer layer, an active layer is disposed on the n-GaN layer, a p-GaN layer is disposed on the active layer, and a p-electrode layer is disposed on the p-GaN layer. The at least two support members define at least one air cavity between the substrate and the first buffer layer.

A portion of the lower electrode layer above one of the at least two support members may be exposed.

According to one example embodiment, a semiconductor piezoelectric sensor includes a substrate, at least two support members, a first buffer layer, a lower electrode layer, a second buffer layer, a GaN thin layer, and an upper electrode layer. At least two support members are partially disposed on the substrate. A first buffer layer is configured to extend along surfaces of the at least two support members. A lower electrode layer is disposed on the first buffer layer, a second buffer layer is disposed on the lower electrode layer, a GaN thin layer is disposed on the second buffer layer, and an upper electrode layer is disposed on the GaN thin layer. The at least two support members define at least one air cavity between the substrate and the first buffer layer.

According to one example embodiment, a method of fabricating a semiconductor device includes forming a sacrificial layer on a substrate, forming a first buffer layer on the sacrificial layer, forming an electrode layer on the first buffer layer, forming a second buffer layer on the electrode layer, partially etching the sacrificial layer to form at least two support members configured to support the first buffer layer and at least one air cavity between the substrate and the first buffer layer, and forming a GaN thin layer on the second buffer layer.

The method may further include forming a strain compensation layer on the second buffer layer before forming the GaN thin layer. The method may further include forming a GaN buffer layer on the strain compensation layer before forming the GaN thin layer. The GaN thin layer formed on the second buffer layer may be an n-GaN thin layer.

The method may further include forming an active layer on the n-GaN thin layer, forming a p-GaN thin layer on the active layer, and forming a p-electrode layer on the p-GaN thin layer. The method may further include partially exposing the electrode layer disposed under the second buffer layer by partially etching portions of the second buffer layer, the n-GaN thin layer, the active layer, the p-GaN thin layer, and the p-electrode layer.

The forming the electrode layer may include patterning the electrode layer. The method may further include forming an upper electrode layer on the GaN thin layer. The method may further include partially exposing the electrode layer by partially etching portions of the second buffer layer, the GaN thin layer, and the upper electrode layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
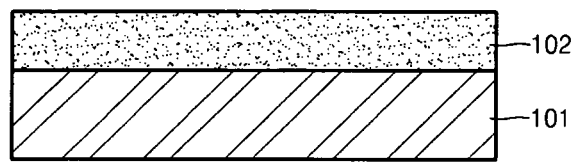
FIGS. 1A through 1F are cross-sectional views illustrating a method of fabricating a gallium nitride (GaN) thin layer, according to an example embodiment.
Figure 1B:
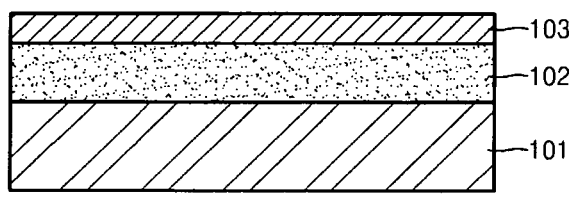

Reference will now be made in detail to example embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects of the present description.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a gallium nitride (GaN) film structure, a method of fabricating the structure, and a semiconductor device including the structure, according to some example embodiments, will be described in detail. In the drawings, the thicknesses of layers or regions are exaggerated for clarity.

FIGS. 1A through 1F are cross-sectional views illustrating a method of fabricating a GaN thin layer, according to an example embodiment. Referring to FIG. 1A, a sacrificial layer 102 may be formed on a substrate 101. The substrate 101 may be formed of sapphire, silicon carbide, silicon, or glass. Also, the sacrificial layer 102 may be formed of an insulating material, for example, silicon oxide ($SiO_2$). Afterwards, referring to FIG. 1B, a first buffer layer 103 may be formed on the sacrificial layer 102. The first buffer layer 103 may serve as a seed layer to form an electrode layer (refer to 104 in FIG. 1C) during a subsequent process.

Furthermore, the first buffer layer 103 may act as an etching stop layer during a subsequent process of etching the sacrificial layer 102 and also act as a support layer suspended above the substrate 101 after the etching of the sacrificial layer 102. Accordingly, the first buffer layer 103 may be formed of a material that may have structurally sufficient stiffness so as to support other layers formed thereon, resist temperature and gas conditions under which a GaN thin layer is formed and an etchant with respect to the sacrificial layer 102, and have a similar crystal structure and coefficient of thermal expansion to GaN crystals. For example, the first buffer layer 103 may be formed of a material, such as aluminum nitride (AlN) or silicon nitride ($SiN_x$). In particular, AlN has a relatively high melting point of about 3000° C. or higher and desirable chemical stability and mechanical properties.

Figure 1C:
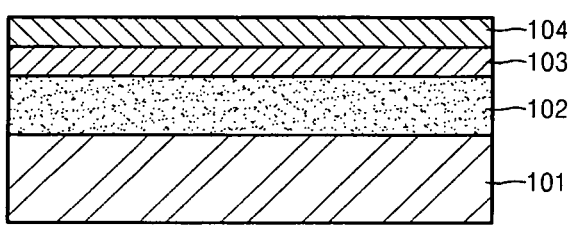

Referring to FIG. 1C, an electrode layer 104 may be formed on the first buffer layer 103. The electrode layer 104 may act as a seed layer for a second buffer layer (refer to 105 in FIG. 1D) to be formed thereon. Also, the electrode layer 104 may act as a microheater to maintain a layer-forming temperature during subsequent formation of a GaN thin layer. Accordingly, the electrode layer 104 may be formed of a material that may resist higher temperatures and have a similar lattice constant and coefficient of thermal expansion to GaN crystals. For example, the electrode layer 104 may be formed of molybdenum (Mo), titanium (Ti), ruthenium (Ru), chrome nitride (CrN), or tantalum nitride (TaN). The electrode layer 104 may be used as a lower electrode of a semiconductor device finally fabricated. Furthermore, the electrode layer 104, which is formed of Mo, may serve as a reflection layer of a light emission device due to a high reflectance thereof.

Figure 1D:
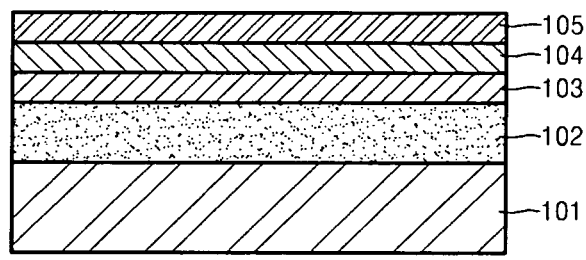

Thereafter, referring to FIG. 1D, a second buffer layer 105 may be formed on the electrode layer 104. The second buffer layer 105 may serve as a seed layer for forming a GaN thin layer (refer to 106 in FIG. 1F) during a subsequent process. Accordingly, the second buffer layer 105 may be formed of a material having a similar crystalline structure and coefficient of thermal expansion to a GaN crystalline structure. For example, the second buffer layer 105 may be formed of AlN.

Figure 2:
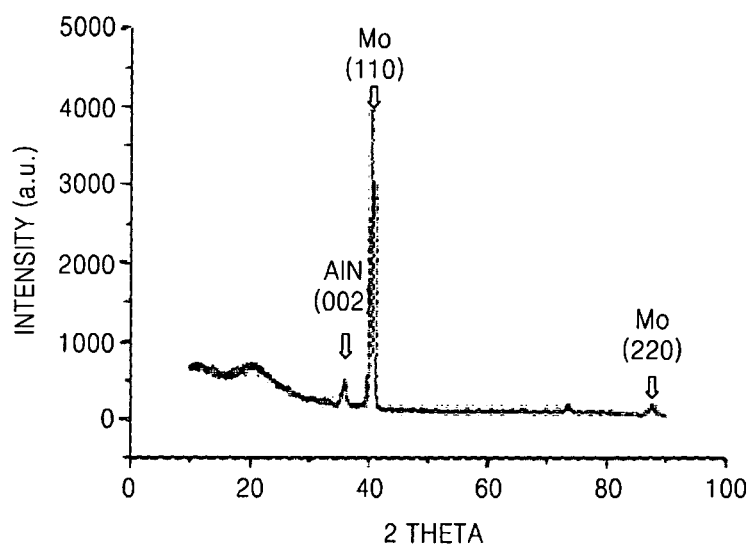
FIG. 2 is a graph showing X-ray diffractometer (XRD) results of a first buffer layer, a electrode layer, and a second buffer layer grown on a glass substrate in the method shown in FIGS. 1A through 1F.

FIG. 2 is a graph showing X-ray diffractometer (XRD) results of the first buffer layer 103, the electrode layer 104, and the second buffer layer 105 grown on the glass substrate 101. Here, the first and second buffer layers 103 and 105 were formed of AlN and the electrode layer 104 was formed of Mo. Thus, an AlN/Mo/AlN film structure was formed entirely on the glass substrate 101. Referring to FIG. 2, a Mo layer used as the electrode layer 104 was grown as a preferred orientation layer along a (110) plane. Also, an AlN layer grown as the second buffer layer 105 on the electrode layer 104 has a (0002) orientation.

Accordingly, it may be concluded that the first buffer layer 103 formed of AlN was an appropriate seed layer for growing the electrode layer 104 and the second buffer layer 105. Also, the second buffer layer 105 may be an appropriate seed layer for growing a GaN thin layer. That is, by forming the electrode layer 104 on the first buffer layer 103, the film quality of the electrode layer 104 may be improved, so that the film quality of the second buffer layer 104 formed on the electrode layer 104 may also be improved. This may also assist in improving the film quality of a subsequent GaN thin layer 106.

Figure 1E:
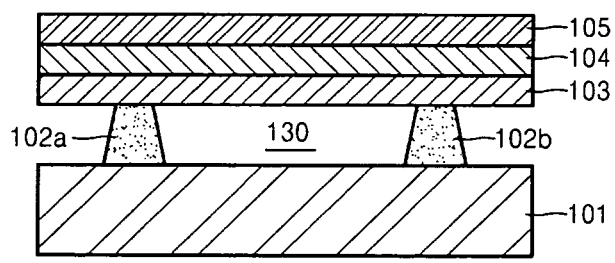

Referring to FIG. 1E, the sacrificial layer 102 may be partially etched, thereby forming at least one air cavity 130 between the substrate 101 and the first buffer layer 103. After the etching process, the remaining portion of the sacrificial layer 102 may be support members 102a and 102b configured to support the first buffer layer 103, the electrode layer 104, and the second buffer layer 105. Accordingly, the first buffer layer 103, the electrode layer 104, and the second buffer layer 105 may remain suspended above the substrate 101 by the two support members 102a and 102b disposed on the substrate 101.

Due to a suspension structure having at least one air cavity 130 formed between the substrate 101 and the first buffer layer 103, heat generated by the electrode layer 104 during a subsequent process of growing the GaN thin layer 106 may be minimized or reduced from being transmitted to the substrate 101. Thus, the substrate 101 may be prevented or inhibited from being deformed due to a higher temperature. Furthermore, since stress applied to the substrate 101 and the GaN thin layer 106 due to a difference in a coefficient of thermal expansion between the substrate 101 and the GaN thin layer 106 is reduced by the at least one air cavity 130, the occurrence of cracks in the GaN thin layer 106 may be prevented or inhibited.

Figure 1F:
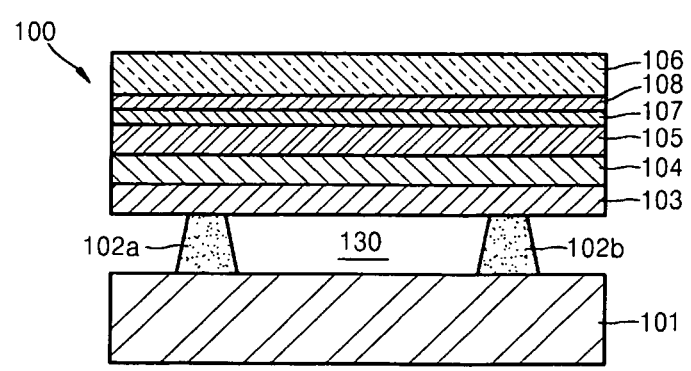

After etching the sacrificial layer 102, as shown in FIG. 1F, the GaN thin layer 106 may be finally formed on the second buffer layer 105. During the growth of the GaN thin layer 106, current may be applied to the electrode layer 104 so that the electrode layer 104 may generate heat. Accordingly, the electrode layer 104 may function as a microheater configured to maintain a layer-forming temperature during the growth of the GaN thin layer 106. The growth of the GaN thin layer 106 may be performed using, for example, a metal organic chemical vapor deposition (MOCVD), a molecular beam epitaxy (MBE), or a hydride vapor phase epitaxy (HVPE) method. Furthermore, as shown in FIG. 1F, after a strain compensation layer 107, such as an AlGaN layer, or a GaN buffer layer 108 is formed on the second buffer layer 105, the GaN thin layer 106 may be grown thereon.

Figure 3:
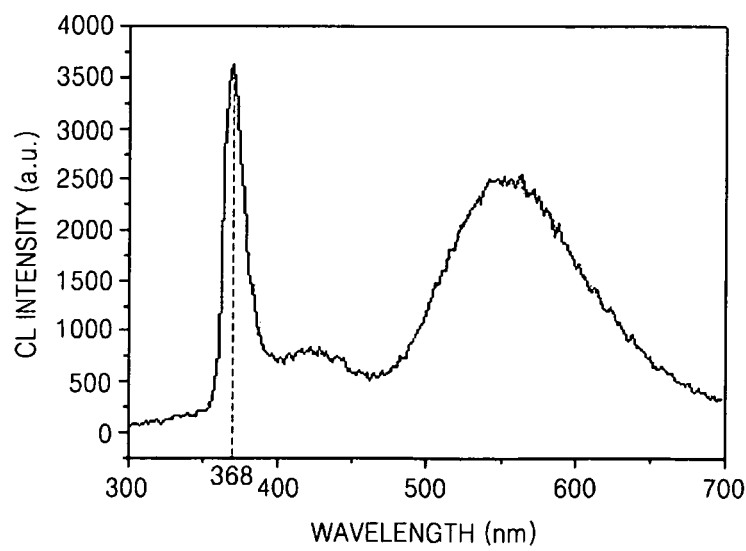
FIG. 3 is a graph showing cathode luminescence (CL) characteristics of a GaN thin layer grown using the method shown in FIGS. 1A through 1F.

As a result, a GaN film structure 100 in which the first buffer layer 103, the electrode layer 104, the second buffer layer 105, and the GaN thin layer 106 are suspended above the substrate 101 may be completed. FIG. 3 is a graph showing cathode luminescence (CL) characteristics of a GaN thin layer grown using the above-described method. Referring to FIG. 3, which shows intrinsic emission characteristics of GaN crystals, it may be confirmed that the GaN crystals had a peak at a wavelength of about 368 nm. Accordingly, a desirable GaN thin layer 106 was formed.

As described above, according to a method of fabricating a GaN thin layer, according to an example embodiment, since the GaN thin layer 106 is grown on the structure of the first buffer layer 103, the electrode layer 104, and the second buffer layer 105 suspended above the substrate 101, the influences of differences in lattice constant or coefficient of thermal expansion between the GaN thin layer 106 and the substrate 101 may be reduced. Accordingly, the GaN thin layer 106 may be grown using a large-area amorphous substrate, such as a glass substrate, in large quantities at low cost.

In addition, after the first buffer layer 103, the electrode layer 104, and the second buffer layer 105, which act as seed layers, are sequentially formed, the GaN thin layer 106 may be formed, thus enabling growth of high-quality GaN crystals. For instance, since the first buffer layer 103 may improve the film quality of the electrode layer 104 and also improve the film quality of the second buffer layer 105 formed on the electrode layer 104, the film quality of the GaN thin layer 106 formed on the second buffer layer 105 may be further improved.

Furthermore, since the electrode layer 104 may also function as a lower electrode or reflection layer of a semiconductor device fabricated using the GaN thin layer 106, subsequent processes of fabricating the semiconductor device using the GaN thin layer 106 may be facilitated or shortened. In one example, FIGS. 4A through 4H are cross-sectional views illustrating a method of fabricating a semiconductor light emission device, according to an example embodiment.

Figure 4A:
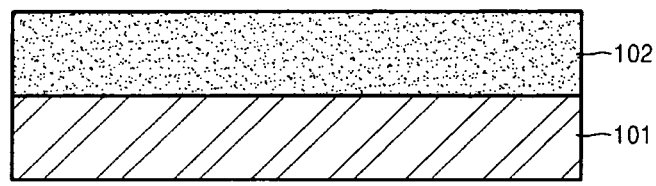
FIGS. 4A through 4H are cross-sectional views illustrating a method of fabricating a semiconductor light emission device according to an example embodiment.
Figure 4B:
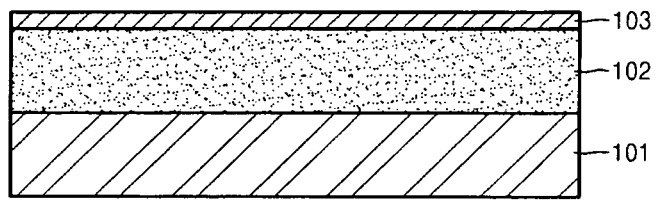
Figure 4C:
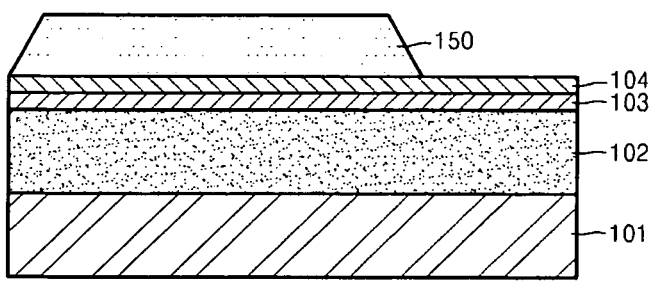
Figure 4D:
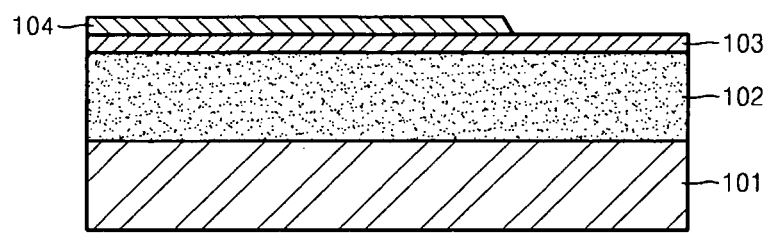

Referring to FIG. 4A, a sacrificial layer 102 may be on a substrate 101. As described above, the substrate 101 may be formed without any particular limitation on materials, and the sacrificial layer 102 may be formed of an insulating material, such as SiO$_2$. Also, as shown in FIG. 4B, a first buffer layer 103 may be formed on the sacrificial layer 102. As shown in FIG. 4C, an electrode layer 104 may be formed on the first buffer layer 103. The electrode layer 104 may act as a microheater during subsequent formation of a GaN thin layer 106 and also act as a lower electrode of a completed semiconductor light emission device. Accordingly, the electrode layer 104 may be patterned to have a predetermined or given pattern according to the design of a desired semiconductor light emission device. For example, after a mask 150 is partially formed on the electrode layer 104, the electrode layer 104 may be patterned as shown in FIG. 4D. As a result, a portion of the electrode layer 104 on which the mask 150 is not formed may be removed so that the electrode layer 104 may have a predetermined or given pattern. However, since the patterning of the electrode layer 104 may be selectively performed, the patterning of the electrode layer 104 may be omitted depending on the structure of the lower electrode of the semiconductor light emission device.

Figure 4E:
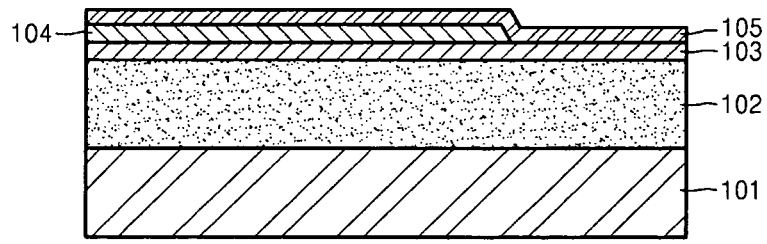
Figure 4F:
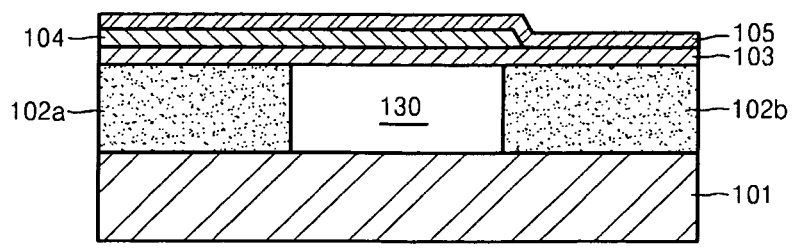

Thereafter, as shown in FIG. 4E, a second buffer layer 105 may be formed on the patterned electrode layer 104. The second buffer layer 105 may be formed also on an exposed portion of the first buffer layer 103 from which a portion of the electrode layer 104 may be removed during the patterning process. As described above, the first buffer layer 103, the electrode layer 104, and the second buffer layer 105 may be formed of AlN, Mo, and AlN, respectively. Thereafter, as shown in FIG. 4F, the sacrificial layer 102 may be partially removed by etching to form at least two support members 102a and 102b. As a result, the first buffer layer 103, the electrode layer 104, and the second buffer layer 105 supported by the at least two support members 102a and 102b may remain suspended above the substrate 101. Thus, at least one air cavity 130 may be partially formed between the substrate 101 and the first buffer layer 103.

Figure 4G:
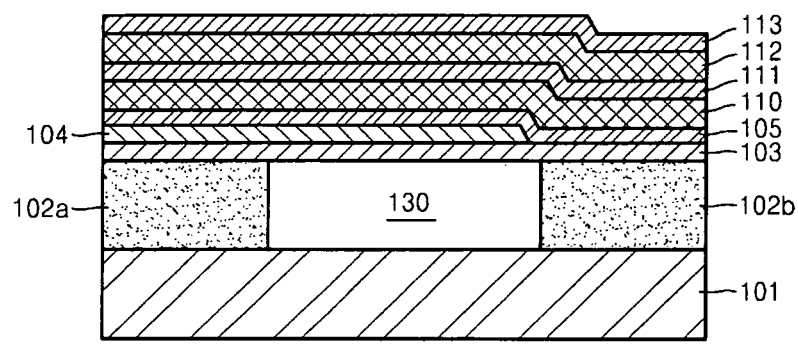
Figure 4H:
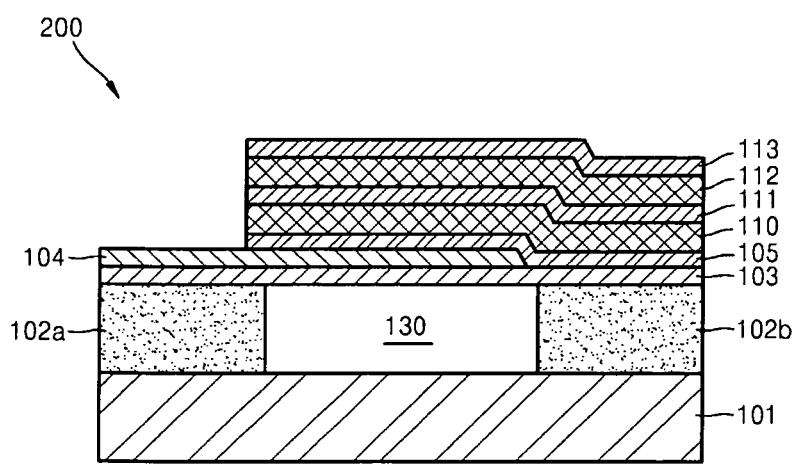

In addition, as shown in FIG. 4G, an n-GaN layer 110, an active layer 111, a p-GaN layer 112, and a p-electrode layer 113 may be sequentially formed on the second buffer layer 105. For example, the n-GaN layer 110 may be formed by growing GaN crystals using the above-described method of growing the GaN thin layer 106 while doping Si, and the p-GaN layer 112 may be formed by doping beryllium (Be). Also, the active layer 111 may have, for example, a multiple quantum well (MQW) structure formed of indium gallium nitride (InGaN)/gallium nitride (GaN). Furthermore, during growth of the n-GaN layer 110, the active layer 111, and the p-GaN layer 112, current may be applied to the electrode layer 104 to generate heat. Finally, as shown in FIG. 4H, portions of the second buffer layer 105, the n-GaN layer 110, the active layer 111, the p-GaN layer 112, and the p-electrode layer 113 may be removed by etching, thereby partially exposing the electrode layer 104 functioning as a lower electrode.

Thus, a semiconductor light emission device 200 having a structure suspended above the substrate 101 may be fabricated. When the electrode layer 104 is formed of Mo, the electrode layer 104 may also serve as a reflection electrode. According to an example embodiment, a semiconductor light emission device 200 having a vertical stack structure may be simply fabricated without any additional process. After the light emission device 200 is completed, the substrate 101 and the sacrificial layer 102 may be removed or may not be removed but remain intact.

Although FIGS. 4A through 4H illustrate an example of a method of fabricating the semiconductor light emission device 200 using the above-described method of growing the GaN thin layer, other semiconductor devices may be also fabricated using the above-described method of growing the GaN thin layer. For example, FIG. 5 shows a cross-sectional view of a semiconductor piezoelectric sensor 300 fabricated using a GaN thin layer grown using the above-described method.

Figure 5:
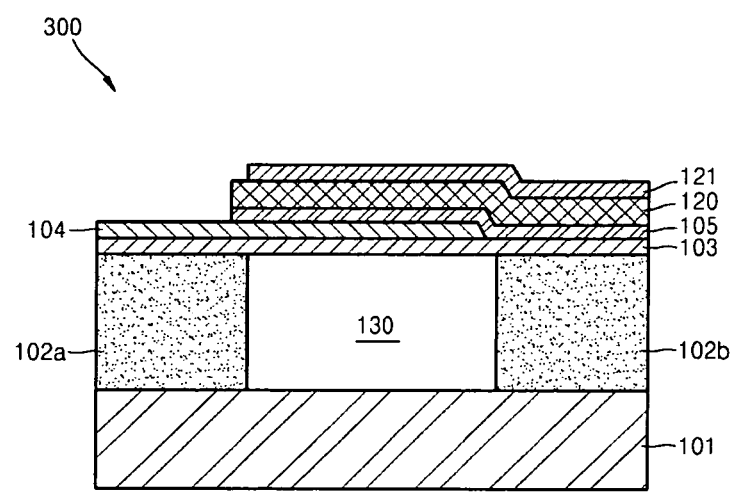
FIG. 5 is a cross-sectional view of a piezoelectric sensor fabricated using a GaN thin layer grown using the method shown in FIGS. 1A through 1F.

Referring to FIG. 5, the semiconductor piezoelectric sensor 300 may include a substrate 101, at least two support members 102a and 102b partially disposed on the substrate 101, and a first buffer layer 103, an electrode layer 104, a second buffer layer 105, a GaN thin layer 120, and an upper electrode layer 121 sequentially disposed on the support members 102a and 102b. Also, at least one air cavity 130 may be formed between the substrate 101 and the first buffer layer 103. For the same reason as described with reference to FIG. 4D, the electrode layer 104 may be optionally patterned. Also, portions of the second buffer layer 105, the GaN thin layer 120, and the upper electrode layer 121 may be removed to expose a portion of the electrode layer 104 serving as a lower electrode. The GaN thin layer 120 may serve as a piezoelectric semiconductor layer. The semiconductor piezoelectric sensor 300 may be fabricated using a similar method to the semiconductor light emission device 200 shown in FIGS. 4A through 4H. Accordingly, according to an example embodiment, a wide variety of semiconductor devices may be conveniently fabricated using the method of growing the GaN thin layer 106 shown in FIGS. 1A through 1F.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A gallium nitride (GaN) film structure comprising:
   at least two support members partially disposed on a substrate;
   a first buffer layer configured to extend along surfaces of the at least two support members;
   an electrode layer in direct contact with the first buffer layer;
   a second buffer layer disposed on the electrode layer; and
   a GaN layer disposed on the second buffer layer,
   wherein the at least two support members define at least one air cavity between the substrate and the first buffer layer.

2. The structure of claim 1, wherein the first buffer layer comprises at least one of aluminum nitride (AlN) and silicon nitride (SiNX).

3. The structure of claim 1, wherein the electrode layer comprises at least one of molybdenum (Mo), titanium (Ti), ruthenium (Ru), chrome nitride (CrN) and tantalum nitride (TaN).

4. The structure of claim 1, wherein the second buffer layer comprises aluminum nitride (AlN).

5. The structure of claim 1, further comprising:
   a strain compensation layer interposed between the second buffer layer and the GaN layer.

6. The structure of claim 5, further comprising:
   a GaN buffer layer interposed between the strain compensation layer and the GaN layer.

7. A semiconductor device comprising the GaN film structure of claim 1.

8. A semiconductor light emission device comprising:
   at least two support members partially disposed on a substrate;
   a first buffer layer configured to extend along surfaces of the at least two support members;
   a lower electrode layer in direct contact with the first buffer layer;
   a second buffer layer disposed on the lower electrode layer;
   an n-GaN layer disposed on the second buffer layer;
   an active layer disposed on the n-GaN layer;
   a p-GaN layer disposed on the active layer; and
   a p-electrode layer disposed on the p-GaN layer,
   wherein the at least two support members define at least one air cavity between the substrate and the first buffer layer.

9. The device of claim 8, wherein a portion of the lower electrode layer above one of the at least two support members is exposed.

10. A semiconductor piezoelectric sensor comprising:
at least two support members partially disposed on a substrate;
a first buffer layer configured to extend along surfaces of the at least two support members;
a lower electrode layer in direct contact with the first buffer layer;
a second buffer layer disposed on the lower electrode layer;
a gallium nitride (GaN) layer disposed on the second buffer layer; and
an upper electrode layer disposed on the GaN layer,
wherein the at least two support members define at least one air cavity between the substrate and the first buffer layer.

11. The structure of claim 5, wherein the strain compensation layer is formed of AlGaN.

12. The semiconductor light emission device of claim 8, further comprising:
a strain compensation layer interposed between the second buffer layer and the n-GaN layer, the strain compensation layer formed of AlGaN.

13. The semiconductor piezoelectric sensor of claim 10, further comprising:
a strain compensation layer interposed between the second buffer layer and the GaN layer, the strain compensation layer formed of AlGaN.

14. The structure of claim 3, wherein the electrode layer is formed of molybdenum (Mo).

15. The semiconductor light emission device of claim 8, wherein the lower electrode layer is formed of molybdenum (Mo).

16. The semiconductor piezoelectric sensor of claim 10, wherein the lower electrode layer is formed of molybdenum (Mo).

17. The structure of claim 1, wherein a surface of the first buffer layer contacting the at least two support members is substantially planar.

18. The semiconductor light emission device of claim 8, wherein a surface of the first buffer layer contacting the at least two support members is substantially planar.

19. The semiconductor piezoelectric sensor of claim 10, wherein a surface of the first buffer layer contacting the at least two support members is substantially planar.

\* \* \* \* \*